United States Patent [19]

Jansen

[11] 4,386,323
[45] May 31, 1983

[54] ARRANGEMENT FOR SYNCHRONIZING THE PHASE OF A LOCAL CLOCK SIGNAL WITH AN INPUT SIGNAL

[75] Inventor: Gerardus L. M. Jansen, Eindhoven, Netherlands

[73] Assignee: U.S. Philips Corporation, New York, N.Y.

[21] Appl. No.: 227,892

[22] Filed: Jan. 23, 1981

[30] Foreign Application Priority Data

Jan. 31, 1980 [NL] Netherlands ............ 8000606

[51] Int. Cl.³ .............................................. H03L 7/00
[52] U.S. Cl. ...................................... 328/63; 375/119; 328/55; 328/61
[58] Field of Search ...................... 328/55, 56, 61, 63; 307/512; 375/119, 118

[56] References Cited

U.S. PATENT DOCUMENTS

| | | | |
|---|---|---|---|
| 3,029,389 | 4/1962 | Morphet | 328/55 |
| 3,509,471 | 4/1970 | Puente | 328/55 |
| 4,027,261 | 5/1977 | Laurent et al. | 328/63 |
| 4,169,995 | 10/1979 | Wise et al. | 328/63 |

Primary Examiner—John S. Heyman
Attorney, Agent, or Firm—Thomas A. Briody; William J. Streeter; Edward W. Goodman

[57] ABSTRACT

Synchronizing the phase of a locally generated clock signal with the phase of an input signal is usually effected by using a phase-locked loop, but this has a drawback that a certain run-in time is necessary to be sure that the phase of the clock signal is stable. The present arrangement comprises a delay line (2) having taps (3), the delay line being driven by a crystal oscillator 1. Clock signal versions C1(0), C1(90), C1(180) and C1(270) which are phase shifted relative to one another through 90° available at the successive taps (3). A coincidence detection circuit comprising trigger circuits (9) and a combining network (10) detects the version of the clock signal whose ascending edge, for example, is located nearest to an ascending edge of the data signal, and this version is supplied as the clock signal at an output (8) by the selective control of switches (7) by control signals from the outputs (13) of the network (10).

3 Claims, 2 Drawing Figures

ARRANGEMENT FOR SYNCHRONIZING THE PHASE OF A LOCAL CLOCK SIGNAL WITH AN INPUT SIGNAL

BACKGROUND OF THE INVENTION

The invention relates to an arrangement of a kind suitable for synchronizing the phase of a locally generated clock signal with the phase of an input signal, comprising a clock signal generator and a delay line, an input of which is connected to the generator, the delay line having a plurality of taps which are distributed along the delay line.

Such an arrangement is disclosed in the U.S. Pat. No. 3,509,471. In this known arrangement, the phase of the locally generated clock signal is compared with the phase of the input signal. The phase difference between these two signals is applied to a control element which, using the tapped delay line, causes the phase of the clock signal to be shifted step-by-step until the clock signal is in synchronism with the input signal.

Such an arrangement has the drawback that a certain run-in period is required before the phase of the regenerated clock has been obtained and is stable. In this period no reliable data transport can take place.

SUMMARY OF THE INVENTION

It is an object of the invention to provide an arrangement of the above kind by means of which it is possible to acquire very rapidly, more specifically within the duration of one cycle of the clock signal, the phase of the input signal and to maintain it thereafter.

According to the invention an arrangement of the above kind is characterized in that each tap of the delay line is connected to an output of the arrangement by a respective controllable switch, that the arrangement further comprises a coincidence detection circuit having inputs and outputs, each input being connected to a respective tap of the delay line and each output being connected to a control input of a respective one of the switches and the coincidence detection circuit further being connected to an input terminal to which the input signal is to be applied and being operable for generating, when there occurs coincidence of the input signal, following an edge thereof, with an edge of the clock signal version at one of the taps of the delay line, a control signal at one of the outputs of the coincidence circuit for closing the particular switch connecting a selected tap to said output of the arrangement.

An advantage of the arrangement according to the invention is that, because the absence of counters and dividers, the arrangement can rapidly synchronize a clock signal up to a bit frequency which is equal to the maximum clock frequency of the logic used. When, for example, the logic is realized in LOCMOS, which has now a maximum clock frequency of 20 MHz, then the clock signal can be regenerated up to a bit rate of 20 Mbit/sec.

A preferred embodiment of an arrangement according to the invention for synchronizing the phase of a locally generated clock signal, with the phase of an input signal is characterized in that the coincidence detection circuit comprises a plurality of bistable trigger circuits, each having a trigger input, a data input, a set and a reset input and an output, that each of the trigger inputs is connected to a respective input of the coincidence detection circuit, that all the data inputs are connected to said input terminal, that the coincidence detection circuit further comprises a combining network having inputs and outpus, that the inputs of the combining network are so connected to the trigger circuit outputs as to select the trigger circuit which is triggered first, and that the outputs of the combining network are connected respectively to the outputs of the coincidence detection circuit.

DESCRIPTION OF THE DRAWINGS

The invention and its advantages will now be further explained, by way of example, with reference to the accompanying drawings, of which.

DESCRIPTION OF THE PREFERRED EMBODIMENT

Figure 1:
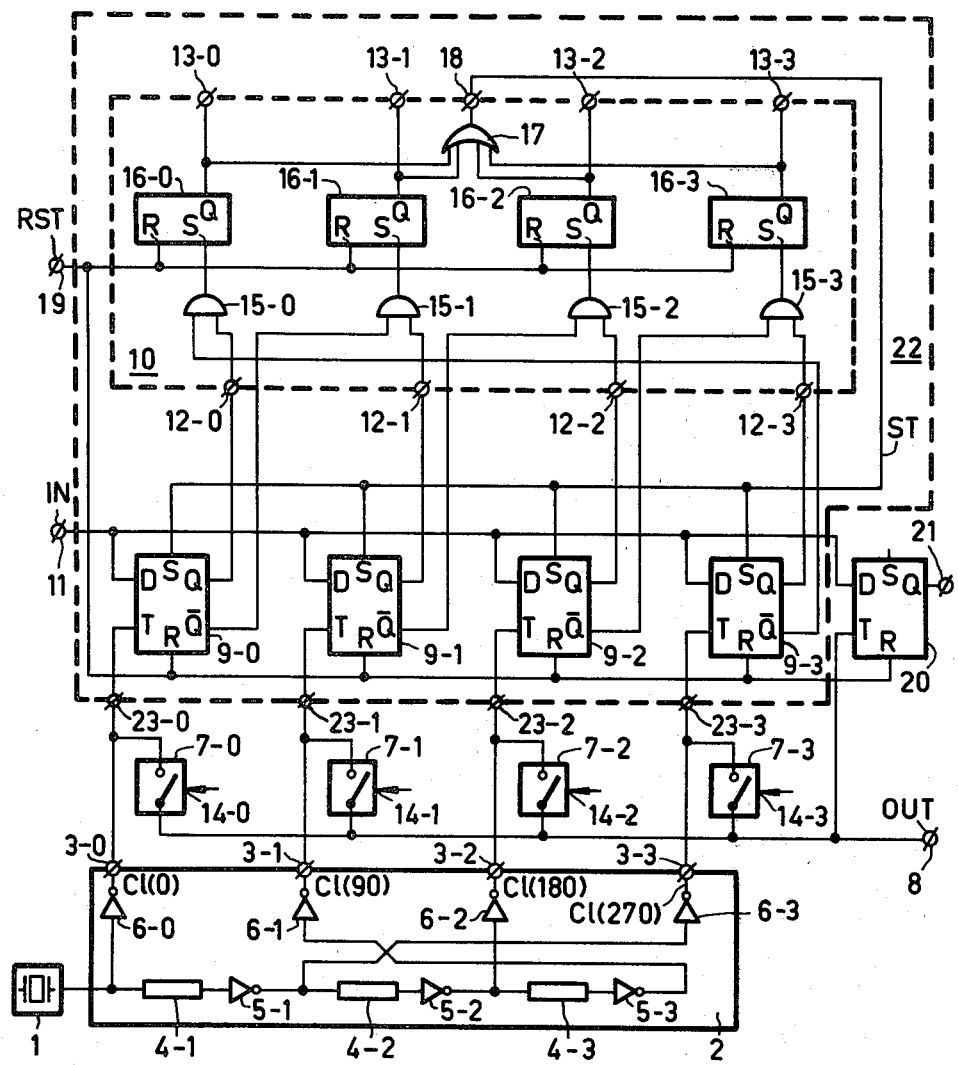
FIG. 1 shows a preferred embodiment of a synchronizing arrangement according to the invention.

In the preferred embodiment of the synchronizing arrangement shown in FIG. 1 an oscillator 1, for example a crystal oscillator, is connected to a delay line 2, which has a number of sections. This delay line 2 has tapping points 3-0, 3-1, 3-2 and 3-3, denoted taps, which are distributed along it. Each section produces the same time delay, which has been so chosen in this example that clock signal versions Cl(O), Cl(90), Cl(180) and Cl(270) whose phase is shifted 90° relative to one another of the clock signal generated by the crystal oscillator 1 are present at the tape 3-0, 3-1, 3-2, 3-3, such that the clock signal version at tap 3-0 has a phase of 0°, that a tap 3-1 has a phase of 90°, that at tap 3-2 has a phase of 180° and that a tap 3-3 has a phase of 270°, with respect to the original clock signal.

The delay line 2 may be, for example, a cable having taps, a cascade arrangement of LC-networks or, as shown in FIG. 1, a cascade arrangement of sections comprised of respective resistors 4-1, 4-2 and 4-3 and respective inverters 5-1, 5-2 and 5-3. The taps 3-0, 3-1, 3-2, 3-3 are connected to the sections via respective inverters 6-0, 6-1, 6-2 and 6-3. The time delay of a section is composed of the propagation time of its inverter (5) and the time constant formed by its resistor (4) and the input capacitance of its inverter (5). Each one of the taps 3-0, 3-1, 3-2 and 3-3 of the delay line 2 is connected to an output 8 of the arrangement by means of an associated controlled switch 7-0, 7-1, 7-2 and 7-3. When, for example, switch 7-0 is closed and the other switches (7-1, 7-2 and 7-3) are open, the undelayed clock signal (which has a phase of 0°) derived from oscillator 1 is then available at output 8. By closing one of the other switches, for example switch 7-2, and opening the remaining switches (7-0, 7-1 and 7-3), the clock signal is available at output 8 with a phase which is shifted through 180°. In this manner it is possible to have a clock signal available at output 8 with, optionally, one of the phases 0°, 90°, 180° and 270°. The phase which is the optimum phase as regards the detection of the data signal will be chosen. The optimum phase occurs when the leading edge of a clock signal is in the center of a data signal bit to be detected. The signal then available at output 8 is the desired, regenerated clock signal, whose phase will correspond within ±45° with the optimum phase required for detection of the data signal. It will be clear that a smaller phase deviation can be obtained by providing the delay line with more taps than the 4 taps shown in FIG. 1 and by reducing the time delay of each section in proportion therewith.

The arrangement includes a coincidence detection circuit 22 by means of which the switches (7) are operated. The coincidence detection circuit 22 comprises a number of trigger circuits 9-0, 9-1, 9-2 and 9-3 of the D-type and a combinating network 10. The input data signal is applied to an input 11 of the arrangement. The data inputs D of the trigger circuits 9 are all connected to this input 11 and the trigger inputs T are connected to the inputs 23-0, 23-1, 23-2 and 23-3, respectively, of the coincidence circuit 22. The taps 3-0, 3-1, 3-2 and 3-3 are also connected to these inputs. The Q-output of each trigger circuit (9) is connected to a corresponding input (12) of the network 10; that is, the Q-output of the trigger circuit 9-0 is connected to input 12-0, the Q-output of the trigger circuit 9-1 to input 12-1, the Q-output of the trigger circuit 9-2 to input 12-2 and the Q-output of the trigger circuit 9-3 to input 12-3. Outputs (13) of the network 10, which also form the outputs of the coincidence circuit 22, are connected to respective control inputs (14) of the switches (7).

For simplicity, the connection between the outputs (13) and the control inputs (14) are not further shown in FIG. 1. Output 13-0 of the network 10 is connected to control input 14-2, output 13-1 is connected to control input 14-3, output 13-2 is connected to control input 14-0 and output 13-3 is connected to control input 14-1.

The network 10 may be implemented with, for example, a so-called FPLA (Field Programmable Logic Array) or as shown in FIG. 1, by means of separate logic modules. The network 10 as shown in FIG. 1 comprises a number of AND-gates (15), a number of trigger circuits (16) of the SR-type and an OR-gate 17. One input of the AND-gate 15-0 is connected to input 12-0 and the other input is connected to the $\overline{Q}$-output of trigger circuit 9-3; one input of the AND-gate 15-1 is connected to input 12-1 and the other input is connected to the $\overline{Q}$-output of trigger circuit 9-0; one input of the AND-gate 15-2 is connected to inptu 12-2 and the other input is connected to the $\overline{Q}$-output of trigger circuit 9-1; and one input of the AND-gate 15-3 is connected to input 12-3 and the other input is connected to the $\overline{Q}$-output of trigger circuit 9-2. The output of each of the AND-gates 15 is connected to the set input S of the associated trigger circuit (16). The Q-outputs of these trigger circuits 16 are connected to respective outputs (13) of the network 10 and to respective inputs of the OR-gate 17. The output 18 of OR-gate 17 is connected to the set inputs S of the trigger circuits (9). The reset inputs R of the trigger circuits (9) and (16) are connected in common to a reset input terminal 19.

The arrangement shown in FIG. 1 for synchronizing the phase of a locally generated clock signal with the phase of an input signal operates as follows.

Figure 2:
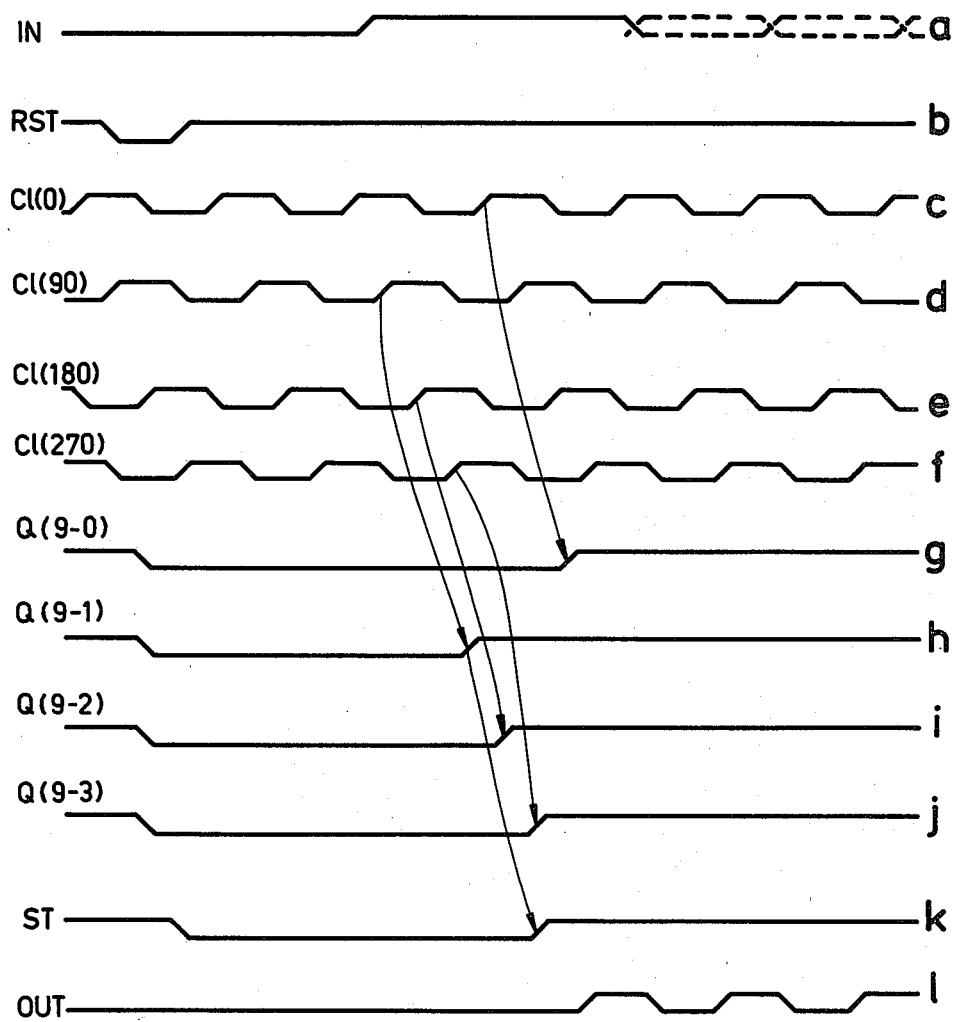
FIG. 2 shows some time diagrams to illustrate the operation of the synchronizing arrangement shown in FIG. 1.

The arrangement shown in FIG. 1 is adjusted to the zero-state by a reset signal RST, shown in FIG. 2b, which is applied to the reset input terminal 19. The input data signal IN applied to input terminal 11, is shown in FIG. 2a. The clock signals generated by oscillator 1 have a shape as shown in FIG. 2c. FIG. 2c also shows the clock signal version C1(0) which is applied to tap 3-0. Each of the other clock signal versions C1(90), C1(180) and C1 (270) which are shifted successively through 90°, as applied to the taps 3-1, 3-2 and 3-3, are shown in FIGS. 2d, 2e and 2f, respectively. The input data signal IN is applied in parallel to the data input D of the trigger circuits 9-0, 9-1, 9-2 and 9-3, each of these circuits being triggered by a different phase version of the clock signal applied to their trigger input T. After the first leading (rising) edge occurs in the input data signal IN, so that this signal is "high", the particular one of the trigger circuits (9) which is connected to receive the clock signal version whose leading (rising) edge follows with the shortest delay after the input data signal IN becomes high, will be triggered first with the other trigger currents (9) being successively triggered thereafter. FIGS. 2g, 2h, 2i, 2j show the Q-output signals resulting from this action. The Q-output of trigger circuit 9-1 will be switched first, followed by that of trigger circuit 9-2, then that of 9-3 and finally that of 9-0. By means of the network 10, it is now determined in the following manner which of the trigger circuits (16) will be switched first. To this end the Q-output of each trigger circuit 9 is connected, together with the $\overline{Q}$-output of the preceding trigger circuit 9, to AND-gates (15), as mentioned previously. In the embodiment of FIG. 2, the AND-gate 15-1 will, consequently, be opened, that is, by the Q-output signal of trigger circuit 9-1 and the $\overline{Q}$-output signal of trigger circuit 9-0, and will set the trigger circuit 16-1, which has its set input S connected to the output of this AND-gate 15-1. The other AND-gates 15-2, 15-3 and 15-0 will not be opened because by the time each receives the Q-output signal from the associated trigger circuit (9), the preceding trigger circuit (9) has already been triggered, so that there is no $\overline{Q}$-output signal at the gate. Thus, in no circumstances will more than one trigger circuit (16) be set. After one of the trigger circuits (16) has been set, OR-gate 17 will produce an output signal ST (FIG. 2k), causing the trigger circuits (9) to be set and to remain in the set state until a reset signal RST is next applied to input 19. At the moment it is switched, the Q-output of trigger circuit 16-1 will apply a signal to the control input 14-3 connected to it. This causes switch 7-3 to be closed so that the clock signal version at the delay line tap 3-3 is available at the output 8 (signal OUT, FIG. 2l) as the synchronized locally generated clock signal.

An advantage of the present arrangement is that, in contrast to other clock regeneration circuits which function by synchronizing the cycle of a counter or a shift register, the clock signal can be rapidly regenerated up to a bit rate of the input data signal which is equal to the maximum clock frequency of the logic used. If, for example, LOCMOS-logic is used with a maximum clock frequency of 20 MHz, then a bit rate of 20 Mbit/sec. can be processed.

In addition, the input data signal can be detected by means of the locally generated clock signal. To this end, FIG. 1 shows, for example, a further trigger circuit 20, the data input D of which is connected to receive the input data signal IN and the trigger input T of which is connected to receive the locally generated clock signal. Output 21 supplies the detected data signal.

In the example chosen in FIG. 2, the trigger circuit 9-1 was triggered first, namely by the clock signal version C1(90) which is shifted through 90°. The fact that ultimately switch 7-3 was closed and that as a consequence the clock signal version C1(270), which is shifted through 270°, was applied to output 8 as the locally generated clock signal is caused by the fact that the clock signal version which is used is the one whose leading (rising) edge is located in the center of the bit of the data signal to be detected. This is achieved by introducing an extra delay of half a clock period (or 180°).

Alternatively, JK-trigger circuits can be used instead of the D-type trigger circuits (9) shown in FIG. 1, and alternatively D-type or JK-type trigger circuits may be used instead of the SR-type trigger circuits (16) shown in FIG. 1.

The arrangement according to the invention for synchronizing the phase of a locally generated clock signal with the phase of an input signal, is particularly suitable when the input data signal consists of data packets. In this case—provided the packet length is not too long—the phase of the incoming sequence will not deviate significantly from the phase of the clock of the receiver: this certainly holds if a crystal-controlled oscillator is included in the data transmitter and the data receiver. Therefore, a non-recurrent synchronization as described above is sufficient. However, the invention is not limited to this. When a continuous data stream is applied, then the usually slow drift of the phase of the crystal oscillator can be readjusted in known manner.

In practice the controllable single-pole switches are implemented as MOSFET transistors, which are controlled via their gates.

What is claimed is:

1. An arrangement for synchronizing the phase of a locally generated clock signal with the phase of an input signal, comprising a clock signal generator and a delay line an input of which is connected to the generator, the delay line having a plurality of taps which are distributed along the delay line, characterized in that the duration of delay in the delay line is equal to a single clock cycle of said clock signal generator and each tap of the delay line is connected to an output of the arrangement by a respective controllable switch, the arrangement further comprising a coincidence detection circuit having inputs and outputs, each input being connected to a respective tap of the delay line and each output being connected to a control input of a respective one of the switches, and the coincidence detection circuit further being connected to an input terminal to which the input signal is to be applied and being operable for generating, when there occurs coincidence of the input signal, following an edge thereof, with an edge of the clock signal version at one of the taps of the delay line, a control signal at one of the outputs of the coincidence circuit for closing the particular switch connecting a selected tap to said output of the arrangement whereby the arrangement is capable of synchronizing the locally generated clock signal with an input signal having a bit rate up to the maximum frequency of the clock signal generator.

2. An arrangement as claimed in claim 1, characterized in that the coincidence detection circuit comprises a plurality of bistable trigger circuits, each having a trigger input, a data input, a set and a reset input and an output, each of the trigger inputs being connected to a respective input of the coincidence detection circuit and all the data inputs are connected to said input terminal, the coincidence detection circuit further comprising a combining network having inputs and outputs, the inputs of the combining network being connected to the trigger circuit outputs so as to select the trigger circuit which is triggered first, and the outputs of the combining network being connected, respectively, to the outputs of the coincidence detection circuit.

3. An arrangement as claimed in claim 2, characterized in that the combining network comprises a plurality of AND-gates and a plurality of further trigger circuits, each of the AND-gates having a first and a second input and an output, the first inputs thereof being connected to a non-inverting output of a respective one of said bistable trigger circuits, the second input of each AND-gate being connected to an inverting output of the bistable trigger circuit preceding the bistable trigger circuit the non-inverting output of which the respective first input is connected, and the output of each AND-gate being connected to a set input of a respective one of the further trigger circuits, the outputs of the further trigger circuits being connected to respective outputs of the combining network and to inputs of an OR-gate, an output of which is connected in common to the set inputs of the bistable trigger circuits, the reset inputs of the further trigger circuits and the reset inputs of the trigger circuits being inter-connected and connected to a reset input terminal.

* * * * *